United States Patent
Stähler et al.

(10) Patent No.: US 11,719,562 B2
(45) Date of Patent: Aug. 8, 2023

(54) SENSOR FOR CONNECTION TO A JOINING PARTNER, ADAPTOR FOR INSTALLING THE SENSOR TO A JOINING PARTNER AND INSTALLATION METHOD FOR INSTALLING THE SENSOR USING THE ADAPTOR ON A JOINING PARTNER

(71) Applicant: effexx Kommunikations- und Meldesysteme GmbH & Co. KG, Siegen (DE)

(72) Inventors: Paul Jörg Stähler, Wilnsdorf (DE); Axel Schneider, Fürthen (DE)

(73) Assignee: EFFEXX KOMMUNIKATIONS- UND MELDESYSTEME GMBH & CO. KG, Siegen (DE)

( * ) Notice: Subject to any disclaimer, the term of this patent is extended or adjusted under 35 U.S.C. 154(b) by 148 days.

(21) Appl. No.: 17/280,173

(22) PCT Filed: Sep. 13, 2019

(86) PCT No.: PCT/EP2019/074499
§ 371 (c)(1),
(2) Date: Mar. 25, 2021

(87) PCT Pub. No.: WO2020/064367
PCT Pub. Date: Apr. 2, 2020

(65) Prior Publication Data
US 2021/0348955 A1 Nov. 11, 2021

(30) Foreign Application Priority Data
Sep. 26, 2018 (DE) .................... 10 2018 123 767.7

(51) Int. Cl.
*G01D 11/30* (2006.01)
*H05K 7/02* (2006.01)

(52) U.S. Cl.
CPC ............... *G01D 11/30* (2013.01); *H05K 7/02* (2013.01)

(58) Field of Classification Search
CPC .................................. G01D 11/30; H05K 7/02
See application file for complete search history.

(56) References Cited

U.S. PATENT DOCUMENTS

| 5,484,094 A | 1/1996 | Gupta |
| 5,577,696 A * | 11/1996 | Kramer ................ G08B 17/113 248/309.4 |
| 2003/0041696 A1 | 3/2003 | Lipsky et al. |

FOREIGN PATENT DOCUMENTS

| DE | 102010003952 A1 * | 10/2011 | ........... H01F 7/0252 |
| FR | 3022970 A1 * | 1/2016 | ............... B25C 1/00 |

(Continued)

OTHER PUBLICATIONS

Int'l Search Report dated Dec. 2, 2019 in Int'l Application No. PCT/EP2019/074499.

*Primary Examiner* — Jamel E Williams
(74) *Attorney, Agent, or Firm* — Panitch Schwarze Belisario & Nadel LLP

(57) ABSTRACT

An adapter for installing a sensor, more particularly designed as a fire alarm, has a sensor housing which can be connected to a building and is designed to accommodate electrical and/or electronic components of the sensor. To simplify and accelerate the installation, an adapter is designed to be connected, by way of a direct installation technique, to the building by means of an adapter top side and to the sensor by means of an adapter bottom side.

12 Claims, 2 Drawing Sheets

(56) References Cited

FOREIGN PATENT DOCUMENTS

| FR | 3022970 A1 | | 1/2016 | |
|---|---|---|---|---|
| GB | 2217495 A | * | 10/1989 | ............. G08B 17/00 |
| GB | 2487560 A | * | 8/2012 | ............. G08B 17/10 |
| WO | 9512476 A1 | | 5/1995 | |
| WO | WO-9512476 A1 | * | 5/1995 | ............. B25C 1/082 |
| WO | WO-02073565 A1 | * | 9/2002 | ............. G08B 29/145 |
| WO | WO-03088167 A2 | * | 10/2003 | ............. G08B 17/10 |

\* cited by examiner

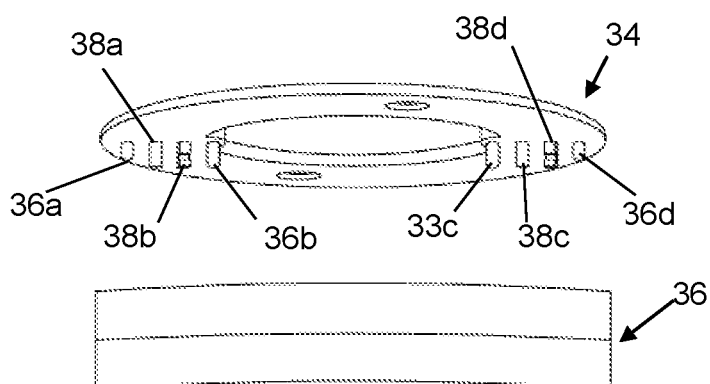
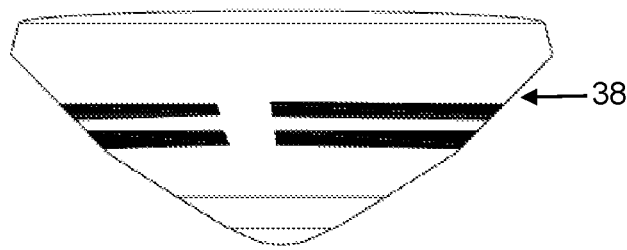
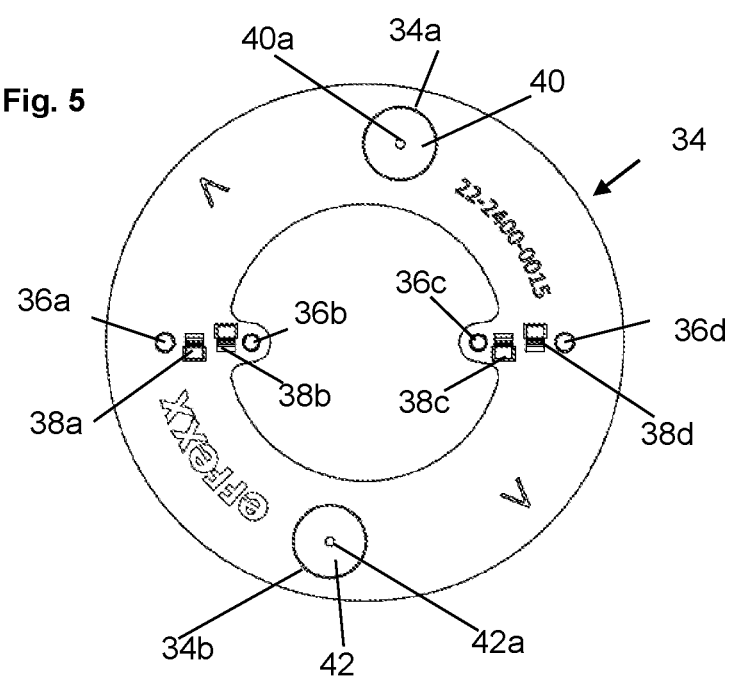

SENSOR FOR CONNECTION TO A JOINING PARTNER, ADAPTOR FOR INSTALLING THE SENSOR TO A JOINING PARTNER AND INSTALLATION METHOD FOR INSTALLING THE SENSOR USING THE ADAPTOR ON A JOINING PARTNER

CROSS-REFERENCE TO RELATED APPLICATION

This application is a Section 371 of International Application No. PCT/EP2019/074499, filed Sep. 13, 2019, which was published in the German language on Apr. 2, 2020 under International Publication WO 2020/064367, which claims priority under 35 U.S.C. § 119 to German Patent Application No. 10 2018 123 767.7, filed on Sep. 26, 2018, the disclosures of each of which are incorporated herein by reference in their entireties.

BACKGROUND OF THE INVENTION

The invention concerns a sensor, in particular a fire alarm, which can be fixed to a joining partner, in particular a ceiling and wall or the like, an adaptor for installing such a sensor, an installation method for installing a sensor to a joining partner, in particular a ceiling or the like, and an installation kit including the sensor and an adaptor. Finally the invention concerns an installation method using an adaptor for a sensor or the like on a joining partner, in particular a ceiling.

STATE OF THE ART AND DISADVANTAGES THEREOF

Known sensors are usually fixed to the ceiling, the wall or another mounting or base surface by drilling holes at a defined target position. For that purpose the sensor is firstly oriented in the target position on the base surface, then holes are drilled therein and dowels are introduced into those holes. The sensor is then screwed to the mounting surface or the ceiling. Correct orientation and installation usually takes about 15 minutes. That is relatively complicated and thus time-consuming in particular in the case of overhead installation.

The installation operations are generally carried out on ladders at relatively great heights of in particular 2 to 6 metres and during the steps of establishing the position for and installation of the sensor both hands are required for those activities. That can result in serious accidents if the installer loses his balance.

OBJECT

Taking the above-mentioned state of the art and the disadvantages that it entails as the basic starting point therefore the object of the present invention is to at least partially avoid those disadvantages and in particular design a sensor such that it is to be installed considerably more easily and in particular more safely.

BRIEF SUMMARY OF THE INVENTION

According to the invention that technical object is already attained by the features of the independent claims in the most abstract configuration. Advantageous but not mandatory developments are recited in the appendant claims.

The invention therefore proposes an adaptor which is adapted to be connected via direct installation procedure with an adaptor top side to the building and with an adaptor underside to the sensor. In the context of that direct installation procedure which is performed with a setting tool, a device frequently also referred to as a bolt firing tool, the step according to the invention of "setting" the adaptor is thus effected, which means that the adaptor is oriented in the target position on the joining partner, in particular a ceiling or wall or another part of a building, and then connected, in particular non-detachably, with the setting tool to the joining partner in the target position, by at least one nail, preferably a plurality of nails being fired with the setting tool through the adaptor, therefore penetrating the adaptor plane defined by the adaptor. That surprisingly simple measure reduces the installation time of the entire sensor from about 15 minutes to about 3 minutes.

Nails of various sizes are accommodated in a plastic magazine in the bolt firing tool which drives them with a compressed air-operated or electrically operated piston through the adaptor into the subjacent wall or ceiling, the nail or bolt then bears with an edge against the adaptor, in particular against the adaptor underside. Bolt firing tools include a piston driven with pyrotechnic energy generation or electrical energy generation, which impacts against a bolt or nail and thus transmits the kinetic energy of the driven piston to the bolt or nail. The piston however never leaves the tool: in the event of empty setting without a bolt or nail or when setting on an excessively soft base surface or with excess energy it is prevented from issuing from the tool by a piston stop ring or a piston brake. It is herein that the essential safety-related difference lies in relation to the bolt setting devices which were earlier widely used and which shot the nail like a projectile at high speed.

More recent bolt firing tools are electrically or battery-operated fixing tools for implementing direct installation procedures, which therefore operate with current or a battery. Those battery-operated setting tools therefore operate in dust-free manner and substantially more quietly so that they can be used without any problem even in the conversion of buildings while continuing to operate. In addition the generation of noise which is inevitable with gas and powder setting tools no longer occurs. The nails or bolts used in the bolt firing tools are usually accommodated in nail magazines which include sleeve or lattice structures of plastic which are arranged in linearly mutually juxtaposed relationship and which respectively receive the individual nails surrounding same peripherally and are connected to each other by way of connecting arms similarly to a cartridge belt.

The sensor can be of any desired configuration, for example in the form of a fire alarm, motion sensor or however a combination of various detectors, wherein the electronics, electrics and/or connector are disposed in a sensor housing or casing formed by the sensor. The technology of the sensor is accommodated in a sensor housing.

The sensor can include a sensor base which can be connected to the housing and a sensor head which can be preferably releasably connected to that sensor base. In that arrangement both the sensor base and also the sensor head accommodate electrical and/or electronic components of the sensor, wherein the actual sensor itself is preferably disposed in the sensor head. Accordingly the sensor base and the sensor head in that respect form the housing of the sensor.

Fixing of the adaptor with the adaptor top side is preferably effected on a ceiling but can also be on any other joining partners, for example a base surface, a vertically extending wall or the like.

Preferably the adaptor is in the form of a substantially plate-shaped or disc-shaped component, is therefore of a markedly small height in relation to the sensor, preferably only some millimetres, like for example 3-6 mm, so that the adaptor sits in plate-like or disc-like configuration and as far as possible invisibly in the installed position between the sensor base and the joining partner, that is to say the wall, ceiling or the base surface. The disc of the adaptor forms an adaptor plane which in the installed position extends parallel to the plane of the joining partner, therefore preferably disposed in parallel downwardly displaced relationship with the ceiling. The adaptor is thus of a substantially smaller height than its width or depth.

If the adaptor in the preferred embodiment partially or completely comprises plastic, being in particular in the form of a one-piece plastic injection moulding, it is also particularly light, weighing therefore only a few grams, for example 30 grams, and in that respect can also be well and easily handled even at installation heights of 2 to 6 metres, in particular 2.5 to 3 metres, and in particular in overhead installation situations.

In the particularly preferred embodiment the adaptor is in the form of a substantially circular ring-shaped or toroidal disc, wherein the disc of the adaptor defines the adaptor plane and the central opening in the disc can be used for example for passing cable therethrough.

The adaptor can be so designed that in the installed position it is enclosed or surrounded by the sensor, and is therefore not visible in the installed position when the adaptor is fitted.

The adaptor can have at least one and preferably two recesses, particularly preferably two recesses provided diametrally at mutually opposite ends of the adaptor, preferably in an adaptor plane defined by the adaptor underside, into which a setting head of the setting tool from which the nail issues can be inserted with as little play as possible so that the nail passes through a nail discharge opening provided in that recess. The recesses therefore function as positioning recesses which simplify accurate arrangement and positioning of the setting tool, in particular the bolt guide thereof, on the adaptor. Accordingly that recess therefore operates as a centring aid for the setting head and also for receiving the plastic of the nail magazine, that surrounds the respective nail and is released when the nail passes through the central nail opening in the adaptor.

If the setting tool is arranged on a setting tool holder with bars the configuration according to the invention allows particularly simple installation without using ladders even on ceilings at a height of 2 to 6 metres. The setting tool holder carries the setting tool and can be connected to a plurality of bars, with which the setting device can be lifted up to the appropriate height and can be actuated there. The bars can be fitted together to give lengths of up to 6 metres or longer. Provided at the lower end of the bars is a trigger for the setting tool, with which the setting tool carried in the setting tool holder can be pressed against the mounting surface and triggered, even at relatively great heights.

The setting tool can also have at the bolt guide or in the proximity thereof, that is to say the discharge end for the nail or bolt, a magnet with which it can be more easily positioned on or connected to a magnetic joining partner or a magnetic element of the adaptor. The adaptor is therefore only still snap-fitted on to the magnet arranged at the bolt guide of the setting tool, so that the adaptor is pre-positioned transversely relative to the bolt guide of the setting tool, more specifically preferably precisely in such a way that after the adaptor top side has been simply pressed against the joining partner without further transposition of the setting tool in relation to the adaptor the nail has only still to be set in the joining partner in order to at least pre-fix the adaptor in the target installation position.

In terms of working safety that affords the crucial advantage that ladders are no longer required for setting the adaptor. Installation at least of the adaptor can therefore be carried out by the installer without using a ladder while standing on the ground, even in relation to joining partners at installation heights of preferably 2 to 6 metres and possibly even greater heights, but preferably at an installation height of 2.5 to 3 metres.

1. Accordingly the configuration of the adaptor according to the invention, using surprisingly simple means, avoids having to go up and down the ladder and permits installation of the adaptor without the installer using the hands to stay safe on the ladder. The installation method on a joining partner, in particular under the ceiling at an installation height, takes place as follows: attaching an adaptor with a first magnetic element to the magnet at the front side of the bolt guide of the setting tool which is arranged in a setting tool holder.

2. Lifting the adaptor with the setting tool by way of the setting tool holder and positioning same beneath a joining partner at the installation height of in particular 2 to 6 metres, in particular a ceiling.

3. Pressing the adaptor with the adaptor top side against the joining partner with the setting tool accommodated in the setting tool holder.

4. Pre-fixing the adaptor to the joining partner, in particular the ceiling, by means of setting a first nail through the adaptor.

5. Possibly connecting further wiring means for the housing or connections.

6. Transposing the bolt guide of the setting tool to a second magnetic element of the adaptor and final fixing of the adaptor by means of setting a second nail to the joining partner, in particular a ceiling.

The final fixing operation can thus also be effected directly after the pre-fixing operation.

Setting according to the invention therefore means that the nail passes through the plane defined by the adaptor, that is to say the adaptor, and connects the adaptor to the joining partner.

For that purpose there can be provided on the adaptor a nail passage opening through which the nail can pass with its shaft through the adaptor when the setting tool sets the nail.

For holding the adaptor to the setting tool the adaptor can have a magnetic element with a nail passage opening, in particular in the form of metal discs on the adaptor underside.

In the particularly preferred embodiment the magnetic element also has a preferably central nail passage opening through which the nail can pass in the setting operation.

In a particularly preferred embodiment the magnetic element is in the form of a metallic support washer arranged on the adaptor.

Particularly preferably the magnetic element is arranged in or accommodated in the adjustment recesses. By passing through the nail passage opening a nail can pass through the magnetic element and the adaptor into the base surface or ceiling which in the installation position is disposed above the adaptor top side.

Particularly preferably two magnetic elements with a nail passage opening, in particular in the form of metal discs, are arranged or accommodated in two diametrally mutually opposite adjusting recesses at the adaptor underside.

It is also in accordance with the invention that the magnetic elements with the nail passage openings can be for example adhesively fixed on the adaptor underside.

For correct orientation of the adaptor in the target position it is appropriate for the adaptor to be oriented at the target position by means of a marking or locating system, that being effected in the particularly simple manner by means of a laser, in particular a cross line laser.

Embodiments include on the adaptor top side which in the installed position is towards the building, to which the adaptor is fixed, include media protection for implementing an IP protection class for example in the form of a rubber cuff, a diaphragm or the like, by means of which sealing integrity is ensured in respect of the sensor installed by means of the adaptor, in relation to the media which occur in the situation of use. That media protection can either be fitted separately or however can already be connected to or arranged on the adaptor at the top side thereof, for example by means of gluing or ultrasonic welding.

Further embodiments include centring aids for correct and simple arrangement of the sensor head and/or base on the adaptor in the correct installation position or orientation. Preferably those centring aids include pins which in the installation position engage into corresponding openings in the joining partner. Embodiments further include two mutually spaced centring pins which define a spacing between them and which engage into end regions on the joining partner, in particular in a slot.

Preferred embodiments of the adaptor include a fixer in the form of quick-action connector for fixing the adaptor to the sensor or sensor base. Such a fixer can be combined with the centring aids.

By way of example the fixer can include latching tabs arranged with or between centring pins. Preferably those latching tabs operate resiliently and have undercut configurations or a hook portion which can operate in particular in opposite directions. That has the advantage that the centring aid with the latching hook is provided at one of the two joining partners (sensor base/sensor head) while only a slot has to be provided at the respective other joining partner at the corresponding locations, with the centring pins engaging into the slot at the ends, and wherein the latching arms or latching hooks engage in an intermediate position laterally in the installation position behind the slot, particularly preferably in opposite relationship at both sides, to provide particularly stable and reliable installation.

It has proven to be particularly preferable for two such pairings including a centring aid and a fixer to be provided, in particular including mutually spaced centring pins, between which latching arms or latching hooks are provided, which are preferably adapted to engage the mutually opposite edges or sides of a slot provided on the joining partner.

Preferably the centring aids and latching hooks are provided on the adaptor and the slot is on the sensor base.

Embodiments include the implementation of the adaptor and the sensor and preferably the entire installation kit from a refractory material. ABS has proven to be appropriate, in which respect however it is evident to the man skilled in the art that other fire-retardant materials can also be used.

It is apparent to the man skilled in the art that the invention in this respect also concerns separately from the sensor an adaptor as described hereinbefore as a stand-alone item and protection is also claimed for same.

In addition the invention concerns an installation method for a sensor, in particular a fire alarm, wherein the sensor preferably includes a sensor base which can firstly be connected to a building and a sensor head which can be releasably connected to the sensor base.

In addition the invention also concerns an installation kit including an adaptor and a sensor, in particular a fire alarm.

Finally the invention concerns an installation method for installing an adaptor for a sensor, in particular in the form of a fire alarm, on a joining partner, in particular a ceiling, at an installation height, more specifically without using a ladder by way of a direct installation procedure.

The proposed installation method includes the following method steps:

applying a first magnetic element on a adaptor underside of a disc-shaped or plate-shaped adaptor to a magnet in a bolt guide of a setting tool which is arranged in a setting tool holder with bars or extension members;

lifting the adaptor held at the bolt guide with the setting tool holder to the installation height;

pressing the adaptor at the installation height in an installation position with an adaptor top side against a joining partner, in particular a ceiling, and pre-fixing the adaptor to the joining partner by means of setting of at least one first nail through the adaptor plane of the adaptor, formed by the adaptor surface, at the installation height.

According to the invention the adaptor is firstly applied with a magnetic element to a magnet on the bolt guide of the setting tool which is accommodated in a setting tool holder having bars or comparable extension members. The setting tool is then lifted by means of the bars of the setting tool holder with the adaptor to the installation height, for example about 2 to 6 metres, and pressed with the adaptor top side against a joining partner. Then the adaptor is pre-fixed to the joining partner at the installation height by a first bolt being shot through the joining partner, for example a ceiling or mounting base surface.

This therefore provides a particularly stable connection for the adaptor and thus also the sensor to the joining partner, insofar as, after the pre-fixing operation, the setting tool is transposed by means of the setting tool holder to at least one further magnetic element of the pre-fixed adaptor and the adaptor is further fixed by at least one second nail being fixed through the adaptor to the joining partner.

In that respect, using surprisingly simple means, the magnetic elements on the adaptor simplify transposition of the setting tool even at the installation height at relatively great heights of up to 2 to 6 metres so that with a simple sideways movement it is virtually automatically positioned on the through opening for the nail in the second magnetic element and the second nail only has to be fired therethrough.

If required further nails can be fixed to further magnetic elements in the same way.

Particularly preferably the magnetic elements are in the form of metal discs or metal plates having a central opening for the nail, which are inserted into corresponding recesses at an underside of the adaptor or are connected in some other fashion to the underside of the adaptor, for example being glued. Those metal discs, in a particularly simple fashion being in the form of support washers, only have to be of a diameter of about 5 to 20 mm. It is apparent to the man skilled in the art that the adaptor and the installation method are not restricted to use with a sensor but can also be used for other devices in housings which have to be fitted to a joining partner at greater heights. Smoke alarms or motion sensors in particular fall to be considered here as sensors.

In the specific description hereinafter reference is made to the accompanying drawings which form a part of this description of the invention and which for illustration purposes show specific embodiments with which the invention can be carried into effect. In this respect directional terminology like for example "upward", "downward", "forward", "rearward", "front", "rear" and so forth is used in relation to the orientations of the described Figure or Figures. As components of embodiments can be positioned in a number of differing orientations the directional terminology serves for illustration and is in no way limiting. It will be appreciated that other embodiments can be used and structural or logical modifications can be made without thereby departing from the scope of protection of the present invention. The following description is not to be interpreted in a limiting sense.

In the context of this description the terms "connected", "joined" and "integrated" are used to describe both a direct and also an indirect connection, a direct or indirect attachment and direct or indirect integration. Identical or similar components are denoted by identical references in the Figures insofar as that is desirable.

Reference numeral lines are lines which join the reference numeral to the part in question. An arrow in contrast which does not touch any part relates to an entire unit towards which it is directed. The Figures moreover are not necessarily true to scale. To illustrate details certain regions are possibly shown on an exaggeratedly large scale.

BRIEF DESCRIPTION OF THE SEVERAL VIEWS OF THE DRAWING

The foregoing summary, as well as the following detailed description of the preferred invention, will be better understood when read in conjunction with the appended drawings. For the purpose of illustrating the preferred invention, there are shown in the drawings embodiments which are presently preferred. It should be understood, however, that the invention is not limited to the precise arrangements and instrumentalities shown. In the drawings:

The terms "upward" and "downward" relate to the view in the Figures.

FIG. 4 shows a side view of an exploded illustration or an installation kit according to a preferred embodiment including an adaptor, an interposed ring-shaped sensor base and a sensor head connected to the sensor base, and FIG. 5 shows a plan view of the adaptor of FIG. 4.

DETAILED DESCRIPTION OF THE INVENTION

Figure 1:
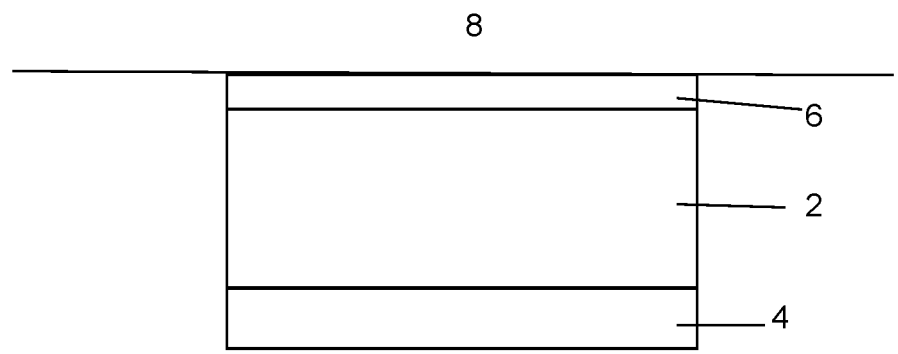
FIG. 1 shows a side view of a sensor according to the invention in the form of a fire alarm, installed beneath a ceiling.

Referring to FIG. 1 the sensor according to the invention includes a sensor base 2 which is of a substantially hollow-cylindrical configuration and a sensor head 4 which is geometrically matched to the external geometry of the sensor base 2 and which can be releasably fixed at the underside to the sensor base 2. The sensor base 2 is connected with its end which is the upper end in the installed position to a ceiling 8 by way of the adaptor 6 according to the invention using a direct installation procedure. In this embodiment the adaptor 6 which is in the form of a plastic component is of an outside diameter of about 11 cm, a height of 6 cm and a weight of about 30 grams.

Figure 2:
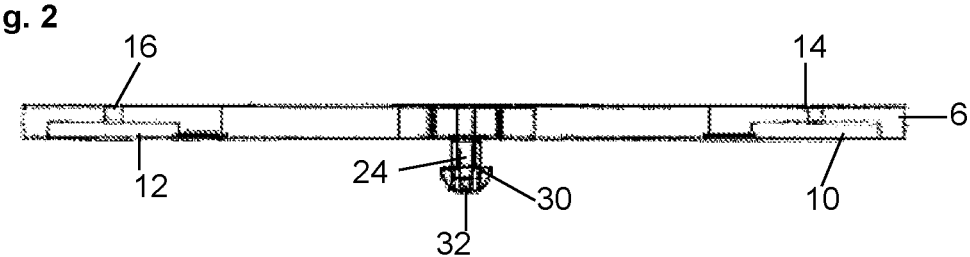
FIG. 2 shows an enlarged cross-section of an adaptor according to the invention.
Figure 3:
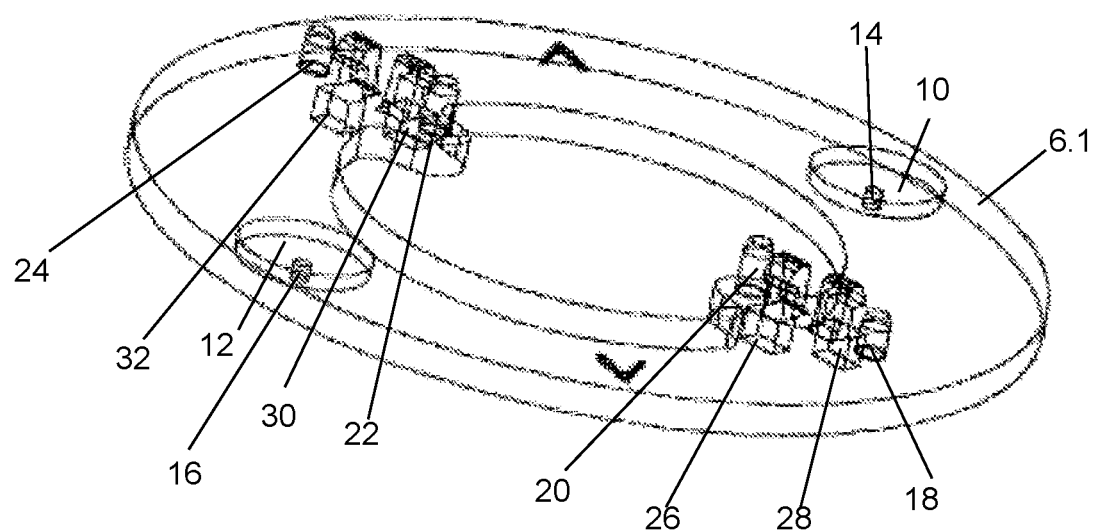
FIG. 3 shows a perspective view of the adaptor of FIG. 2 from below.

For that purpose the adaptor 6 which is shown in greater detail in FIGS. 2 and 3 and which is substantially in the form of a toroidal disc, that is to say a disc in the form of a circular ring, is firstly pressed against the ceiling 8 with the adaptor top side and then the setting head or bolt guide of a bolt firing tool is introduced into circular recesses 10, 12 at the adaptor underside and the setting tool is triggered. In that case the nail which issues from the setting head of the setting tool passes through a central nail opening 14, 16 in the recesses 10, 12 of the adaptor and is joined to the ceiling 8 or the base surface in known fashion.

The part of the nail magazine, that is severed in the fixing operation, can in that situation be received in the recess 10, 12 at the adaptor underside of the adaptor 6 so that no material of the magazine projects beyond the lower surface of the adaptor underside.

Accordingly the adaptor 6 is non-releasably fixed in the target position to the ceiling 8.

Fixing and orientation of the sensor base 2 on the adaptor 6 is effected by means of combined centring aids and a latch provided at the adaptor underside at diametrically opposite ends. The centerer respectively include mutually spaced centring pins 18, 20 and 22, 24 which are provided in pairs and between which latching tabs 26, 28 and 30, 32 which function alternately are provided, which means that the latching tabs 26, 28 and 30, 32 each have outwardly acting latching hooks or undercut configurations which in the installed position engage into longitudinal sides or longitudinal limbs at both sides of a corresponding slot in the sensor base 2.

Consequently there are provided two corresponding slots in the sensor base 2 so that installation of the sensor base 2 to the adaptor 6 is only possible in a pre-defined and desired target position, as is prescribed for example in accordance with the safety-relevant requirements.

It can be seen that the height of the adaptor 6 is only about 4-5 mm, that is to say it is of a markedly smaller height than the sensor base 2 and the sensor head 4. This means that the adaptor 6 fades completely into the background in terms of size in relation to the size of the sensor.

FIG. 4 shows a side exploded view of an installation kit according to the invention including an adaptor 34, a sensor base 36 and a sensor head 38.

In the installation position the annular sensor base 36 is therefore latched to the adaptor underside of the disc-shaped adaptor 34 which is provided with a central through opening and which is fitted to a ceiling (not shown). The sensor head 38 is in turn latched at the underside to the sensor base 36, therefore also being fixed releasably.

FIG. 5 shows a plan view of the adaptor 34 of FIG. 4. This adaptor 34 is again in the form of a disc in the shape of a circular ring and has a central through opening, therefore being of a substantially greater length and width than its thickness, and is therefore of a disc-shaped configuration and virtually disappears in relation to the height of the sensor base 36 and the sensor head 38. This embodiment differs from the embodiment shown in FIGS. 2 and 3 in that, arranged or inserted in the recesses 34*a*, 34*b* provided in diametrically opposite relationship in the adaptor underside, there are two metal discs 40, 42 each having a central nail opening 40*a*, 42*a*, to which a magnet within the setting head of a setting tool can be connected in order in that way to be able to place the adaptor 34 easily in relation to a ceiling or wall even at greater heights of 2 to 6 metres and fix it there, more specifically without using a ladder and thus only from the ground.

Once again fixing and orientation of the sensor base 36 on the adaptor 34 is effected by means of combined centring aids and latch provided at the adaptor underside at diametrally opposite ends. The centring means respectively include mutually spaced centring pins 36a-36d which are provided in pairs and between which are arranged alternately functioning latching hooks 38a-38d which act in opposite directions. This means that the latching hooks 38a-38d are spaced from each other or displaced relative to each other in the radial direction and each have latching hooks or undercut configurations which extend transversely relative to the radial direction and which in the installation position engage into longitudinal sides or longitudinal limbs at both sides of a corresponding slot in the corresponding joining partner, in particular in the sensor base 3.

The releasable connection between the sensor base 36 and the sensor 38 is preferably effected in a similar way to the above-described connection between the adaptor 34 and the sensor base 36, but it can also be implemented in a different fashion. The subject-matter of the present invention ensues not just from the subject-matter of the individual claims but from the combination of the individual claims with each other. All details and features disclosed in the documents—including the Abstract—, in particular the spatial configuration shown in the drawings, are claimed as essential to the invention insofar as they are novel individually or in combination over the state of the art.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

LIST OF REFERENCES 2 sensor base
4 sensor head
6 adaptor
8 ceiling
10, 12 recess
14, 16 nail opening
18, 20 centring pin
22, 24 centring pin
26, 28 latching tab
30, 32 latching tab
34 adaptor
34a, 34b recess
36a-d centring pin
38a-d latching hook
36 sensor base
38 sensor head
40, 42 metal disc
40a, 42a nail passage opening

The invention claimed is:

1. An adaptor for connecting a sensor having an adaptor top side which in the installation position bears against a joining partner and an adaptor underside which can be releasably connected to a sensor housing of the sensor in the installation position, wherein said adaptor is adapted to be connected to a building or a base surface by way of the direct installation procedure and it is of a substantially disc-shaped or plate-shaped configuration, wherein it has at least two recesses on an adaptor underside, and that magnetic elements are arranged or accommodated in the recesses and cooperate with a magnet at a front end of a setting tool and that a metal disc has a nail passage opening, through which a nail can pass upon setting in the course of the direct installation procedure.

2. An adaptor according to claim 1 wherein it includes a connector for connection to the sensor.

3. An adaptor according to claim 1 wherein it has at least one centerer.

4. An adaptor according to claim 3 wherein the centerer includes mutually spaced centring pins and a connector arranged between the same.

5. An adaptor according to claim 4 wherein the centring pins are radially spaced from each other and two latching hooks are respectively arranged at a spacing which is so formed, adapted to engage mutually opposite edges of a slot provided on the joining partner.

6. An adaptor according to claim 1 wherein it is in the form of a plastic component.

7. An adaptor according to claim 1 wherein it is substantially of a ring-shaped configuration and has a central opening passing through an adaptor plane defined by the adaptor.

8. An installation kit including an adaptor according to claim 1 and a fire alarm sensor.

9. An installation method for the installation of an adaptor according to claim 1 for a sensor or the like on a joining partner, at an installation height of about 2 to 6 metres without using a ladder by way of the direct installation procedure including the method steps: attaching a first magnetic element on an underside of the adaptor to a magnet on a bolt guide means of a setting tool which is arranged in a setting tool holder with bars, lifting the adaptor held at the bolt guide means by way of the bars of the setting tool holder to the installation height, pressing the adaptor in an installation position with an adaptor top side against the joining partner and pre-fixing the adaptor to the joining partner by means of setting of at least one first nail through an adaptor plane of the adaptor at the installation height, characterised by the further method step after setting of the first nail: transposing the bolt guide means of the setting tool by means of the setting tool holder at the installation height, connecting the magnet at the bolt guide means to a second magnetic element at the underside of the adaptor, and setting a second nail through the adaptor for final fixing of the adaptor to the joining partner.

10. An installation method according to claim 9 wherein a wiring means or connection of the sensor is provided between the pre-fixing step and the final fixing step of the adaptor at the installation height.

11. An installation method according to claim 9 wherein after fixing of the adaptor to the joining partner by way of the direct installation procedure the sensor is then connected in particular releasably to the adaptor.

12. An installation method according to claim 9 wherein prior to the pre-fixing step the adaptor is firstly oriented on the joining partner, preferably by means of a laser, in particular a cross line laser.

\* \* \* \* \*